United States Patent
Cao

(10) Patent No.: US 11,538,876 B2
(45) Date of Patent: Dec. 27, 2022

(54) LIGHT EMITTING DIODE DISPLAY PANEL WITH ONE OR MORE ENCAPSULATION LAYERS AND MANUFACTURING METHOD THEREOF

(71) Applicants: Hefei Xinsheng Optoelectronics Technology Co., Ltd., Anhui (CN); BOE Technology Group Co., Ltd., Beijing (CN)

(72) Inventor: Binbin Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 334 days.

(21) Appl. No.: 16/673,168

(22) Filed: Nov. 4, 2019

(65) Prior Publication Data
US 2020/0279896 A1 Sep. 3, 2020

(30) Foreign Application Priority Data
Feb. 28, 2019 (CN) .......................... 201910152093.2

(51) Int. Cl.
- H01L 27/32 (2006.01)
- H01L 51/00 (2006.01)
- H01L 51/56 (2006.01)
- H01L 51/52 (2006.01)

(52) U.S. Cl.
CPC ...... *H01L 27/3246* (2013.01); *H01L 51/0018* (2013.01); *H01L 51/5253* (2013.01); *H01L 51/56* (2013.01); *H01L 2227/323* (2013.01)

(58) Field of Classification Search
CPC .............. H01L 27/3246; H01L 27/3244–3279
See application file for complete search history.

(56) References Cited

U.S. PATENT DOCUMENTS

| | | | |
|---|---|---|---|
| 2004/0119419 A1* | 6/2004 | Kai ..................... | H01L 27/3246 315/169.3 |
| 2014/0027731 A1* | 1/2014 | Kim ..................... | H01L 27/3246 257/40 |
| 2016/0111688 A1* | 4/2016 | Lee ........................ | H01L 51/56 438/34 |
| 2018/0175118 A1* | 6/2018 | Toyoda ............... | H01L 27/3211 |

* cited by examiner

*Primary Examiner* — Kevin Parendo
(74) *Attorney, Agent, or Firm* — Nath, Goldberg & Meyer; Joshua B. Goldberg

(57) ABSTRACT

The disclosure provides LED display panel and manufacturing method thereof. LED display panel includes: substrate; LED on substrate; pixel defining layer defining pixel opening on substrate, the LED being within pixel opening; and first encapsulation layer on light emitting side of LED. Portion of first encapsulation layer within pixel opening includes sidewall inclined with respect to substrate, surface of sidewall close to LED includes first portions and second portions alternately arranged in direction away from LED and connected to each other, and inclination angles of first portions with respect to substrate are smaller than those of second portions with respect to substrate. Refractive index of material of first encapsulation layer is greater than refractive index of material of each of layer structures directly on both sides of first encapsulation layer in direction perpendicular to substrate.

17 Claims, 4 Drawing Sheets

US 11,538,876 B2

LIGHT EMITTING DIODE DISPLAY PANEL WITH ONE OR MORE ENCAPSULATION LAYERS AND MANUFACTURING METHOD THEREOF

CROSS-REFERENCE TO RELATED APPLICATION

This application claims the benefit of priority to Chinese Patent Application No. 201910152093.2 filed on Feb. 28, 2019, the contents of which are incorporated herein in their entirety by reference.

TECHNICAL FIELD

The present disclosure relates to the field of display devices, and in particular, to a light emitting diode display panel and a method for manufacturing the light emitting diode display panel.

BACKGROUND

Light emitting diode (LED) display panels are widely used due to their advantages of self-luminescence, short response time, high definition, high contrast, etc.

However, luminous efficiency and power consumption of the LED display panel are still important factors that restrict the development of the LED display panel.

SUMMARY

As an aspect of the present disclosure, there is provided a light emitting diode display panel including: a substrate; a light emitting diode on the substrate; a pixel defining layer on the substrate and defining a pixel opening, the light emitting diode being within the pixel opening; and a first encapsulation layer on a light emitting side of the light emitting diode. A portion of the first encapsulation layer within the pixel opening includes a sidewall inclined with respect to the substrate, a surface of the sidewall close to the light emitting diode includes a plurality of first portions and a plurality of second portions alternately arranged in a direction away from the light emitting diode and connected to each other, and inclination angles of the plurality of first portions with respect to the substrate are smaller than inclination angles of the plurality of second portions with respect to the substrate. A refractive index of a material of the first encapsulation layer is greater than a refractive index of a material of each of layer structures directly on both sides of the first encapsulation layer in a direction perpendicular to the substrate.

In an embodiment of the present disclosure, the plurality of first portions are parallel to the substrate.

In an embodiment of the present disclosure, the inclination angles of the plurality of second portions with respect to the substrate increase in the direction away from the light emitting diode.

In an embodiment of the present disclosure, the pixel defining layer includes a plurality of pixel defining sub-layers stacked in a direction away from the substrate, the pixel opening includes a plurality of pixel sub-openings respectively penetrating through the plurality of pixel defining sub-layers, and opening areas of the plurality of pixel sub-openings increase in the direction away from the substrate.

In an embodiment of the present disclosure, inclination angles of sides of the plurality of pixel sub-openings with respect to the substrate increase in the direction away from the substrate.

In an embodiment of the present disclosure, a material of each pixel defining sub-layer includes a negative photoresist containing a photosensitizer, and a pixel defining sub-layer farther away from the substrate has a higher photosensitizer content.

In an embodiment of the present disclosure, the pixel defining layer includes three pixel defining sub-layers, a photosensitizer content in a pixel defining sub-layer closest to the substrate is 1.5 wt % to 2.5 wt %, a photosensitizer content in a pixel defining sub-layer farthest from the substrate is 4 wt % to 5 wt %, and a photosensitizer content in a pixel defining sub-layer in the middle of the three pixel defining sub-layers is 2.8 wt % to 3.8 wt %.

In an embodiment of the present disclosure, the first encapsulation layer is made of an inorganic material.

In an embodiment of the present disclosure, the light emitting diode display panel further includes a second encapsulation layer directly on a side of the first encapsulation layer away from the light emitting diode, the second encapsulation layer is made of an organic material, and a refractive index of the first encapsulation layer is greater than a refractive index of the second encapsulation layer.

In an embodiment of the present disclosure, the light emitting diode includes a first electrode, the first encapsulation layer is directly on the first electrode, and the first electrode is conformal with the first encapsulation layer.

In an embodiment of the present disclosure, the first electrode is a transparent electrode.

In an embodiment of the present disclosure, the first encapsulation layer is uniform in thickness.

In an embodiment of the present disclosure, the light emitting diode display panel further includes a driver circuit layer between the substrate and the pixel defining layer and configured to drive the light emitting diode to emit light.

As another aspect of the present disclosure, there is provided a method for manufacturing a light emitting diode display panel, including: providing a substrate; forming a pixel defining layer on the substrate, the pixel defining layer defining a pixel opening; forming a light emitting diode on the substrate, the light emitting diode being formed within the pixel opening; forming a first encapsulation layer on a light emitting side of the light emitting diode such that a portion of the first encapsulation layer within the pixel opening includes a sidewall inclined with respect to the substrate, a surface of the sidewall close to the light emitting diode includes a plurality of first portions and a plurality of second portions alternately arranged in a direction away from the light emitting diode and connected to each other, and inclination angles of the plurality of first portions with respect to the substrate are smaller than inclination angles of the plurality of second portions with respect to the substrate. A refractive index of a material of the first encapsulation layer is greater than a refractive index of a material of each of layer structures directly on both sides of the first encapsulation layer in a direction perpendicular to the substrate.

In an embodiment of the present disclosure, the plurality of first portions are formed to be parallel to the substrate.

In an embodiment of the present disclosure, the inclination angles of the plurality of second portions with respect to the substrate increase in the direction away from the light emitting diode.

In an embodiment of the present disclosure, forming the pixel defining layer includes: forming a plurality of pixel defining sub-layers which are stacked in a direction away from the substrate, the pixel opening includes a plurality of pixel sub-openings respectively penetrating through the plurality of pixel defining sub-layers, and opening areas of the plurality of pixel sub-openings increase in the direction away from the substrate.

In an embodiment of the present disclosure, inclination angles of sides of the plurality of pixel sub-openings with respect to the substrate increase in the direction away from the substrate.

In an embodiment of the present disclosure, forming the pixel defining layer includes: sequentially forming a plurality of pixel defining material layers, wherein a material of each pixel defining material layer includes a negative photoresist and a photosensitizer, and a pixel defining material layer farther away from the substrate has a higher photosensitizer content; exposing a stacked structure formed by the plurality of pixel defining material layers by using a same mask; developing the stacked structure to obtain the pixel opening, wherein the pixel opening includes a plurality of pixel sub-openings which sequentially penetrate through the plurality of pixel defining material layers, and among the plurality of pixel sub-openings, a pixel sub-opening which is farther away from the substrate has a greater opening area.

In an embodiment of the present disclosure, in sequentially forming the plurality of pixel defining material layers, three pixel defining material layers are formed, wherein a photosensitizer content in a pixel defining material layer closest to the substrate is 1.5 wt % to 2.5 wt %, a photosensitizer content in a pixel defining material layer farthest from the substrate is 4 wt % to 5 wt %, and a photosensitizer content in a pixel defining material layer in the middle of the three pixel defining material layers is 2.8 wt % to 3.8 wt %.

BRIEF DESCRIPTION OF THE DRAWINGS

The accompanying drawings, which serve to provide a further understanding of the present disclosure and constitute a part of this specification, are used for explaining the present disclosure together with the following specific implementations, rather than limiting the present disclosure. In the drawings.

DETAILED DESCRIPTION

Specific implementations of the present disclosure will be further described in detail below in conjunction with the accompanying drawings. It should be understood that, the specific implementations described herein are merely used for describing and explaining the present disclosure, rather than limiting the present disclosure.

Figure 1:
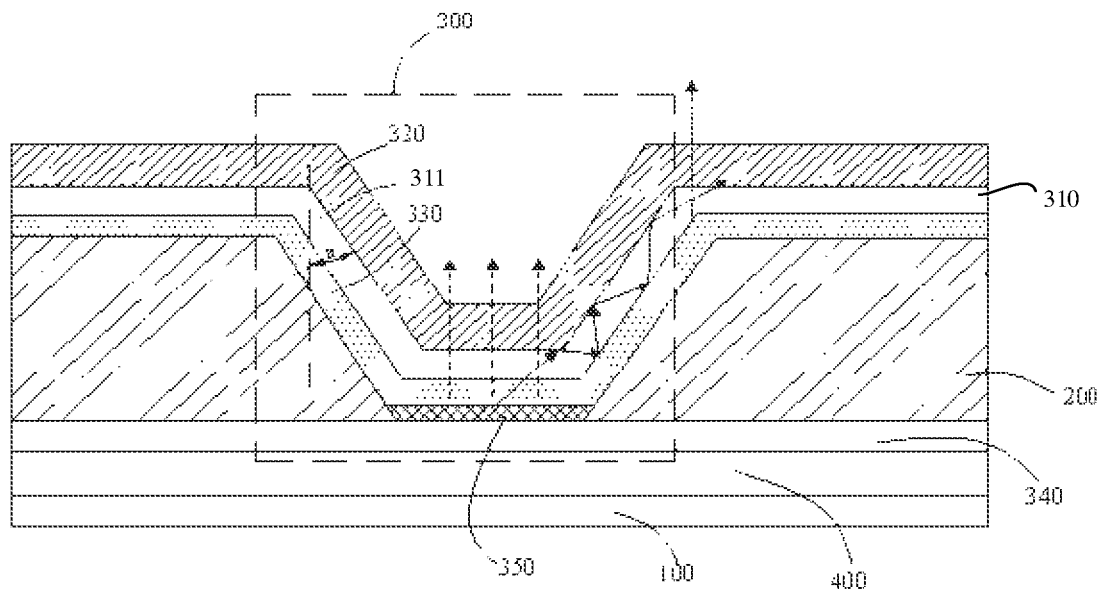
FIG. 1 is a schematic diagram illustrating light emission of a light emitting diode in a light emitting diode display panel.

FIG. 1 is a schematic diagram illustrating light emission of a light emitting diode in a light emitting diode display panel.

The light emitting diode display panel includes a substrate 100, a driver circuit layer 400 formed on the substrate 100, a pixel defining layer 200 formed on a side of the driver circuit layer 400 away from the substrate 100, a light emitting diode 300, and an encapsulation layer. The light emitting diode 300 includes a first electrode 330, a light emitting functional layer 350, and a second electrode 340. The encapsulation layer includes a first encapsulation layer 310 directly on the first electrodes 330 of a plurality of light emitting diodes and a second encapsulation layer 320 on a side of the first encapsulation layer 310 away from the first electrodes 330. Generally, the first encapsulation layer 310 is made of an inorganic material, and the second encapsulation layer 320 is made of an organic material.

The pixel defining layer 200 defines a plurality of pixel openings, and the first encapsulation layer 310 includes a first inner encapsulation portion 311 positioned within the pixel opening.

It should be noted that "an element is directly on another element" and "an element is directly on a side of another element" as used in this disclosure means that two elements are in direct contact, and no intermediate element is present therebetween. In addition, "an inclination angle with respect to the substrate" as used in this disclosure refers to an inclination angle with respect to a plane in which the substrate is located. In addition, "a side of the pixel opening" as used in this disclosure refers to a surface enclosing the pixel opening, through which the pixel opening can be defined.

The material for forming the first electrode 330 of the light emitting diode is ITO which is a transparent electrode material, the material for forming the first encapsulation layer 310 is mostly silicon nitride, and the material for forming the second encapsulation layer 320 is resin. A refractive index of ITO is 1.7 to 2.0, a refractive index of silicon nitride is 1.9 to 2.1, and a refractive index of resin is usually between 1.5 and 1.6. The first inner encapsulation portion 311 is an optically denser medium with respect to the first electrode 330, and the first inner encapsulation portion 311 is also an optically denser medium with respect to the second encapsulation layer 320.

As shown in FIG. 1, an inclination angle α of a sidewall of the first inner encapsulation portion 311 with respect to a thickness direction of the light emitting diode display panel is constant, and a direction of light emitted from the light emitting layer of the light emitting diode 300 is uncertain. Some of the light emitted from the light emitting diode 300, which is referred to as totally reflected light (as indicated by solid arrows in FIG. 1), is totally reflected when it is irradiated at the interface between the sidewall of the first inner encapsulation portion 311 and the second encapsulation layer 320, and then is projected to and also totally reflected at the interface between the sidewall of the first inner encapsulation portion 311 and the first electrode 330. The totally reflected light cannot be emitted out until it reaches a portion of the first encapsulation layer 310 outside the pixel opening, thereby reducing the light emitting ratio of the light emitting diode.

In view of the above, as an aspect of the present disclosure, a light emitting diode display panel is provided. The light emitting diode display panel according to the present disclosure includes: a substrate; a light emitting diode on the substrate; a pixel defining layer on the substrate and defining a pixel opening, the light emitting diode being within the pixel opening; and a first encapsulation layer on a light emitting side of the light emitting diode. A portion of the first encapsulation layer within the pixel opening includes a sidewall inclined with respect to the substrate, a surface of the sidewall close to the light emitting diode includes a plurality of first portions and a plurality of second portions alternately arranged in a direction away from the light emitting diode and connected to each other, and inclination angles of the plurality of first portions with respect to the substrate are smaller than inclination angles of the plurality of second portions with respect to the substrate. A refractive index of a material of the first encapsulation layer is greater than a refractive index of a material of each of layer structures directly on both sides of the first encapsulation layer in a direction perpendicular to the substrate. According to an embodiment of the present disclosure, the plurality of first portions are parallel to the substrate. According to an embodiment of the present disclosure, the inclination angles of the plurality of second portions with respect to the substrate increase in the direction away from the light emitting diode.

Figure 2A:
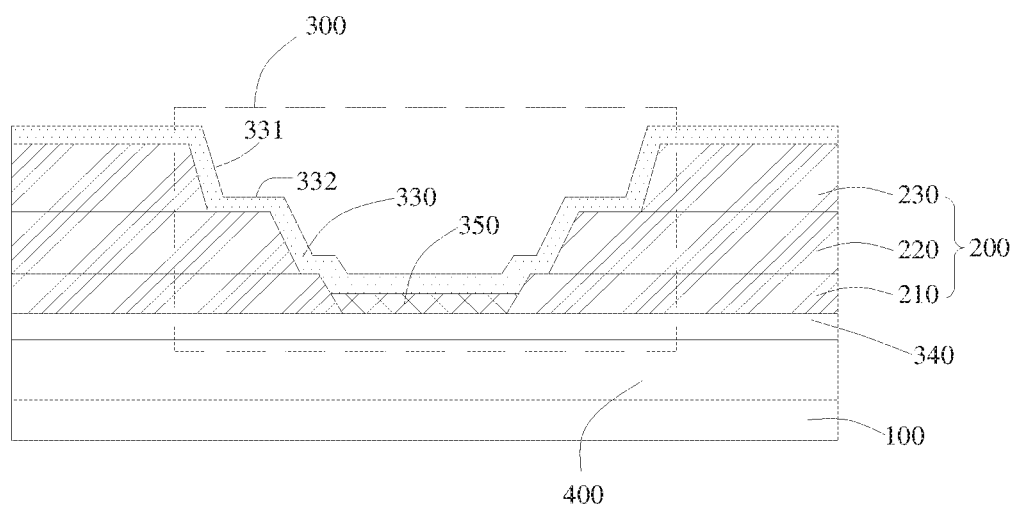
FIG. 2A is a schematic structural diagram of a light emitting diode in a light emitting diode display panel according to an embodiment of the present disclosure.
Figure 2B:
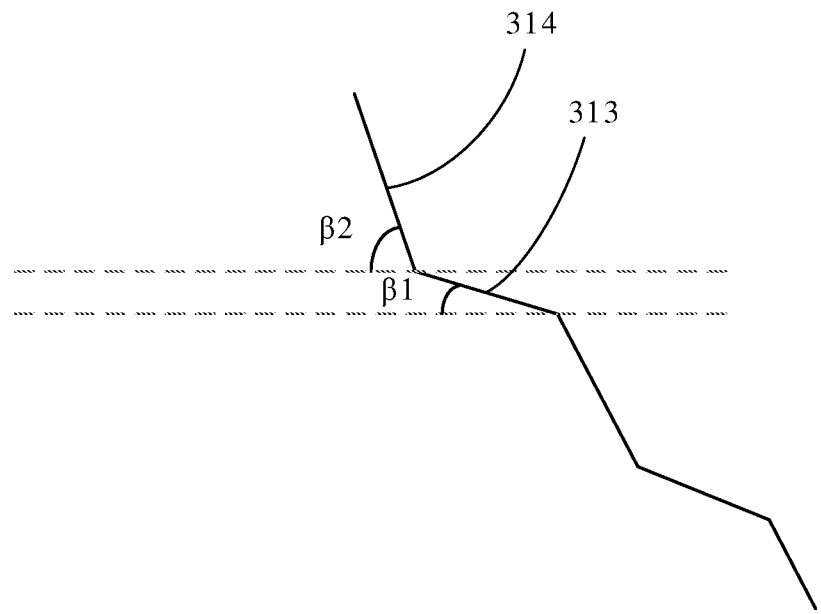
FIG. 2B is a schematic diagram illustrating the inclination of a first encapsulation layer with respect to a plane where a substrate is located in a light emitting diode display panel according to an embodiment of the present disclosure.
Figure 3:
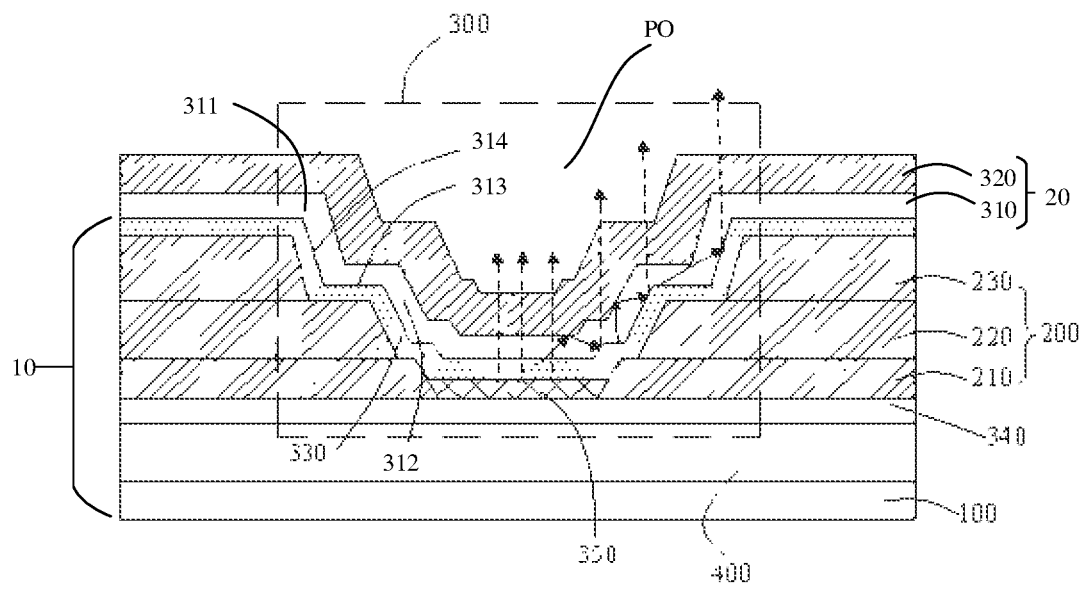
FIG. 3 is a schematic structural diagram of a light emitting diode display panel according to an embodiment of the present disclosure.

FIG. 2A is a schematic structural diagram of a light emitting diode in a light emitting diode display panel according to an embodiment of the present disclosure, FIG. 2B is a schematic diagram illustrating the inclination of a first encapsulation layer with respect to a plane where a substrate is located in a light emitting diode display panel according to an embodiment of the present disclosure, and FIG. 3 is a schematic structural diagram of a light emitting diode display panel according to an embodiment of the present disclosure. As shown in FIG. 3, the light emitting diode display panel includes a light emitting diode display substrate 10 and an encapsulation layer 20 encapsulating the light emitting diode display substrate 10. As shown in FIG. 2A, the light emitting diode display substrate 10 includes a substrate 100, a pixel defining layer 200 formed on the substrate 100, and a plurality of light emitting diodes 300, the pixel defining layer 200 defines a plurality of pixel openings PO, and each pixel opening PO has a light emitting diode 300 disposed therein. Each light emitting diode 300 includes a transparent first electrode 330 at a side of the light emitting diode away from the substrate. The encapsulation layer 20 includes a first encapsulation layer 310 at a light emitting side of the light emitting diode 300. The first encapsulation layer 310 is directly on a side of the first electrode 330 away from the substrate 100. A portion of the first encapsulation layer 310 within the pixel opening includes a sidewall 312 inclined with respect to the substrate 100, and a surface of the sidewall 312 close to the light emitting diode 300 includes a plurality of first portions 313 and a plurality of second portions 314 alternately arranged in a direction away from the light emitting diode 300 and connected to each other, and an inclination angle $\beta 1$ of the first portion 313 with respect to the substrate 100 is smaller than an inclination angle $\beta 2$ of the second portion 314 with respect to the substrate 100, as shown in FIG. 2B. It will be understood that in FIG. 2B, the dashed lines indicate directions parallel to the plane where the substrate is located. A refractive index of a material of the first encapsulation layer 310 is greater than a refractive index of a material of the first electrode 330.

In an embodiment of the present disclosure, a portion of the first electrode 330 within the pixel opening PO includes a sidewall portion inclined with respect to the substrate 100. As shown in FIG. 2A, a surface of the sidewall portion of the first electrode 330 close to the first encapsulation layer 310 includes a plurality of reflection surfaces 331 and a plurality of exit surfaces 332 each connected between two adjacent reflection surfaces 331. An inclination angle of the exit surface 332 with respect to the substrate 100 is smaller than an inclination angle of the reflection surface 331 with respect to the substrate 100. In an embodiment of the present disclosure, the first electrode 330 is conformal with the first encapsulation layer 310.

It can be understood that the light emitting diode 300 includes a light emitting functional layer 350 and a second electrode 340, in addition to the first electrode 330. In the direction away from the substrate 100, the second electrode 340, the light emitting functional layer 350 and the first electrode 330 are arranged sequentially. In some embodiments, a driver circuit layer 400 for driving the light emitting diodes 300 to emit light is further formed on the substrate 100.

The first encapsulation layer 310 of the encapsulation layer 20 covers the first electrode 330, and the light emitting diode display panel shown in FIG. 3 can be obtained after the light emitting diode display substrate 10 is encapsulated. Generally, the first encapsulation layer 310 may be formed by chemical vapor deposition. It is easily understood that the first encapsulation layer with a uniform thickness can be obtained by chemical vapor deposition. As shown in FIG. 3, the first encapsulation layer 310 having a uniform thickness is attached on a surface of the first electrode 330 away from the substrate 100. In some embodiments, the plurality of first portions 313 of the first encapsulation layer 310 are parallel to the substrate 100, as shown in FIG. 2A. As shown in FIG. 3, the sidewall of the portion (i.e., the first inner encapsulation portion 311) of the first encapsulation layer 310 within the pixel opening is formed as a stepped sidewall.

For a light emitting diode display panel, there are generally two cases. In a first case, a second encapsulation layer made of an organic matter is arranged on the side of the first encapsulation layer away from the light emitting diode. In a second case, the side of the first encapsulation layer away from the light emitting diode is not provided with the second encapsulation layer (for example, air is present at the outer side of the first encapsulation layer). In both cases, the first encapsulation layer is optically denser than the media on both sides of the first encapsulation layer. For ease of description, an interface between the first inner encapsulation portion 311 and the first electrode 330 is referred to as a first interface, and an interface between the first inner encapsulation portion 311 and an optically thinner medium (e.g., the second encapsulation layer or air) on the side of the first inner encapsulation portion 311 away from the light emitting diode 300 is referred to as a second interface. Since the first encapsulation layer is a film layer with a uniform thickness, neither the first interface nor the second interface is a flat surface. In some embodiments, the first interface includes first reflection interfaces corresponding to the reflection surfaces 331 of the first electrode 330, and first exit interfaces corresponding to the exit surfaces 332 of the first electrode 330. The second interface includes second reflection interfaces parallel to the reflection surfaces 331 and second exit interfaces parallel to the exit surfaces 332.

When the light emitted from the light emitting diode 300 is totally reflected at the second reflection interface (as indicated by the solid arrows in FIG. 3), the light cannot exit from the second reflection interface, but is reflected to the first interface. When the light totally reflected at the second reflection interface is reflected to the first reflection interface of the first interface, the light may be continuously totally reflected; and when the light totally reflected at the first reflection interface is reflected to the second exit interface, the total reflection condition is destroyed due to the presence of the step-like structure, and the light is thus directly emitted out from the second exit interface, and so on. Therefore, when the light emitting diode display panel emits light, the total reflection condition of the light which is subjected to total reflection is destroyed in the transmission process, and the light cannot be continuously subjected to total reflection within the first encapsulation layer, but can be directly emitted out. In this way, the light emitting rate of the light emitting diode display panel is improved, and the energy consumption of the light emitting diode display panel is reduced.

For the light emitting diode 300, the first electrode 330 is generally made of a transparent electrode material. For the light emitting diode display panel, the first encapsulation layer 310 is generally made of silicon nitride (e.g., SiNx). Silicon nitride is an optically denser medium with respect to the transparent electrode material.

The first electrodes of the plurality of light emitting diodes are electrically coupled to form a first electrode layer which is arranged throughout the entire light emitting diode display substrate. In some embodiments, the first electrode layer may be made of an ITO material.

In the present disclosure, the inclination angle of the first portion 313 with respect to the substrate 100 is not particularly limited as long as it is ensured that the condition in which the light is totally reflected is destroyed at the first portion 313 to cause the light to exit from the first encapsulation layer 310. In an embodiment of the present disclosure, the first portion 313 is parallel to the substrate 100, i.e., the inclination angle of the first portion 313 with respect to the substrate 100 is 0°.

In the present disclosure, the method of forming the first encapsulation layer 310 having the surface including the first portions 313 and the second portions 314 is not particularly limited. Similarly, in the present disclosure, the method of forming the first electrode 330 having the surface including the exit surfaces 332 and the reflection surfaces 331 is not particularly limited. For example, an initial electrode layer may be formed first, and then reflection surfaces and exit surfaces may be formed by etching a surface, close to the first encapsulation layer, of a portion of the initial electrode layer within the pixel opening.

In order to reduce the difficulty in manufacturing the light emitting diode display panel and reduce the manufacturing cost, in the embodiment of the present disclosure, as shown in FIG. 3, the pixel defining layer 200 includes a plurality of pixel defining sub-layers stacked in the direction away from the substrate 100, the pixel opening includes a plurality of pixel sub-openings respectively penetrating through the plurality of pixel defining sub-layers, and opening areas of the plurality of pixel sub-openings increase in the direction away from the substrate 100.

In the embodiment shown in FIG. 3, the pixel defining layer 200 includes three pixel defining sub-layers, namely, a first pixel defining sub-layer 210, a second pixel defining sub-layer 220, and a third pixel defining sub-layer 230. The pixel sub-opening in the first pixel defining sub-layer 210 has the smallest area, and the pixel sub-opening in the third pixel defining sub-layer 230 has the largest area. Apparently, the present disclosure is not limited to the case where the pixel defining layer 200 includes three pixel defining sub-layers, and the pixel defining layer 200 may include two pixel defining sub-layers or more than three pixel defining sub-layers.

Since the pixel sub-opening farther from the substrate has a larger opening area among the plurality of pixel sub-openings, the side of the pixel opening is formed as a stepped surface. Therefore, after the pixel defining layer 200 is formed, respective film layers each with a uniform thickness is formed and the first electrode with a uniform thickness is formed, the surface of the sidewall portion of the first electrode within the pixel opening naturally includes the reflection surfaces and the exit surfaces, and the sidewall of the first encapsulating layer within the pixel opening is also formed in a stepped shape.

The greater the inclination angle of the side of the pixel sub-opening with respect to the substrate 100, the greater the angle between the reflection surface of the first electrode attached onto the side of the pixel sub-opening and the substrate, and correspondingly, the greater the angle between the second portion of the first encapsulation layer facing the reflection surface and the substrate 100. The larger the angle between the second portion of the first encapsulation layer facing the reflection surface and the substrate is, the less likely the light irradiating on the second portion of the first encapsulation layer is totally reflected, and the more likely the light exits from the first portion. In the embodiment of the present disclosure, among the plurality of pixel sub-openings, the farther from the substrate 100, the greater the inclination angle of the side of the pixel sub-opening with respect to the substrate. In this way, in the direction away from the substrate 100, the inclination angles of the second portions, which are within the pixel opening and are opposite to the sides of the pixel sub-openings, of the first encapsulation layer formed subsequently with respect to the substrate 100 increase, the incident angles of light incident on the second portions decrease, accordingly, the total reflection is less likely to occur, and the light is more likely to directly exit.

In the present disclosure, the method of forming the plurality of pixel defining sub-layers is not particularly limited. For example, the plurality of pixel defining sub-layers may be formed by exposing and developing the pixel defining layer using a halftone mask.

In order to reduce the number of halftone masks, in the embodiment of the present disclosure, the material of each pixel defining sub-layer includes a negative photoresist containing a photosensitizer, and the photosensitizer contents in the plurality of pixel defining sub-layers increase in the direction away from the substrate, so that the side of the pixel opening is a stepped surface.

It can be easily understood that, the higher the photosensitizer content, the less likely the cross-linking will occur in the exposed portion of the negative photoresist. For example, in order to form a hole penetrating through the photoresist layer, the photoresist layer needs to be exposed using a mask. A part of the mask corresponding to the hole is a light transmissive part, and the rest thereof is a light shielding part. If the negative photoresist has a high photosensitizer content, a portion of the negative photoresist corresponding to the hole is exposed precisely, and the remaining portion thereof is not exposed. In development, only the exposed portion is dissolved, the remaining portion cannot be dissolved, and the sidewall of the hole is also a vertical wall. If the negative photoresist has a low photosensitizer content, the deeper the photoresist layer, the lower the exposure degree, and the wall of the hole formed after development is not a vertical wall but an inclined wall (i.e., the hole in the photoresist has a smaller diameter at a deeper position).

By making the photosensitizer contents of the plurality of pixel defining sub-layers increase in the direction away from the substrate, not only can the side of the pixel opening be formed in a stepped shape, but also the structure described above in which "among the plurality of pixel sub-openings, the inclination angle of the side of the pixel sub-opening farther from the substrate with respect to the substrate is larger" can be obtained.

An exemplary method of forming a pixel defining layer including a plurality of pixel defining sub-layers is briefly described below. The method includes steps of:

sequentially forming a plurality of pixel defining material layers, such that each pixel defining material layer includes a negative photoresist and a photosensitizer, and the pixel defining material layer farther from the substrate has a higher photosensitizer content;

exposing a stacked structure formed by the plurality of pixel defining material layers by using a same mask; and developing the stacked structure.

Since the plurality of pixel defining material layers have different photosensitizer contents, the pixel defining material layer with the higher photosensitizer content has a higher sensibility, and the pixel sub-opening formed after developing the pixel defining material layer with the higher photosensitizer content has a larger area and a steeper side, thereby obtaining a stepped pixel opening. The surface of the portion, on the terraces of the stepped pixel opening, of the side wall of the first inner encapsulation portion is formed as the first portions.

In the present disclosure, the number of the pixel defining sub-layers is not particularly limited. The more the pixel defining sub-layers are, the more the steps are, the more the first portions of the first inner encapsulation portion are, the more the number of times of destroying the total reflection of total reflection light in the process of transmitting in the first inner encapsulation portion is, and the higher the light emitting rate of the light emitting diode is.

As can be seen from FIG. 2A, in the light emitting diode display substrate including the plurality of pixel defining sub-layers, the pixel opening is a stepped hole, and the area of the topmost pixel sub-opening is the largest, so that the light emitting diode display substrate has a higher aperture ratio, which is beneficial to improving the display effect of the display device including the light emitting diode display panel.

In the embodiment shown in FIG. 2A, the pixel defining layer 200 includes three pixel defining sub-layers, namely, a first pixel defining sub-layer 210, a second pixel defining sub-layer 220, and a third pixel defining sub-layer 230, which are sequentially stacked in a direction away from the substrate 100. The pixel sub-opening in the first pixel defining sub-layer 210 has the smallest area, and the pixel sub-opening in the third pixel defining sub-layer 230 has the greatest area.

Accordingly, among the three pixel defining sub-layers, the first pixel defining sub-layer 210 closest to the substrate 100 has the lowest photosensitizer content, and the third pixel defining sub-layer 230 farthest from the substrate 100 has the highest photosensitizer content.

In an embodiment of the present disclosure, the first pixel defining sub-layer 210 closest to the substrate 100 has a photosensitizer content of 1.5 wt % to 2.5 wt %.

In the embodiment of the present disclosure, the second pixel defining sub-layer 220 in the middle of the three pixel defining sub-layers has a photosensitizer content of 2.8 wt % to 3.8 wt %.

In an embodiment of the present disclosure, the third pixel defining sub-layer 230 farthest from the substrate 100 has a photosensitizer content of 4 wt % to 5 wt %.

As described above, each light emitting diode further includes a second electrode 340 disposed at the bottom of the pixel opening, and a light emitting functional layer 350 between the first electrode 330 and the second electrode 340.

In the present disclosure, the specific type of the light emitting diode is not particularly limited, and for example, the light emitting diode may be an organic light emitting diode or a quantum dot light emitting diode.

One of the first electrode 330 and the second electrode 340 is a cathode, and the other is an anode. As an embodiment, the light emitting diode is a top emission type light emitting diode, the first electrode 330 may be a cathode made of an ITO material, and the second electrode 340 may be an anode made of a metal material.

The light emitting diode display substrate 10 shown in FIGS. 2A and 3 further includes a driving circuit layer 400 formed on the substrate 100 and used for driving the light emitting diode to emit light.

In the light emitting diode display panel, the first encapsulation layer mainly serves to prevent the light emitting diode from being corroded by external water vapor and oxygen. In the present disclosure, the specific material of the first encapsulation layer is not particularly limited. In the embodiments of the present disclosure, the first encapsulation layer may be made of an inorganic material, for example, silicon oxide or silicon nitride.

In the embodiment of the present disclosure, the encapsulation layer further includes a second encapsulation layer 320 on a side of the first encapsulation layer 310 away from the light emitting diode 300. The second encapsulation layer 320 may be made of an organic material (e.g., a resin material).

Figure 4:
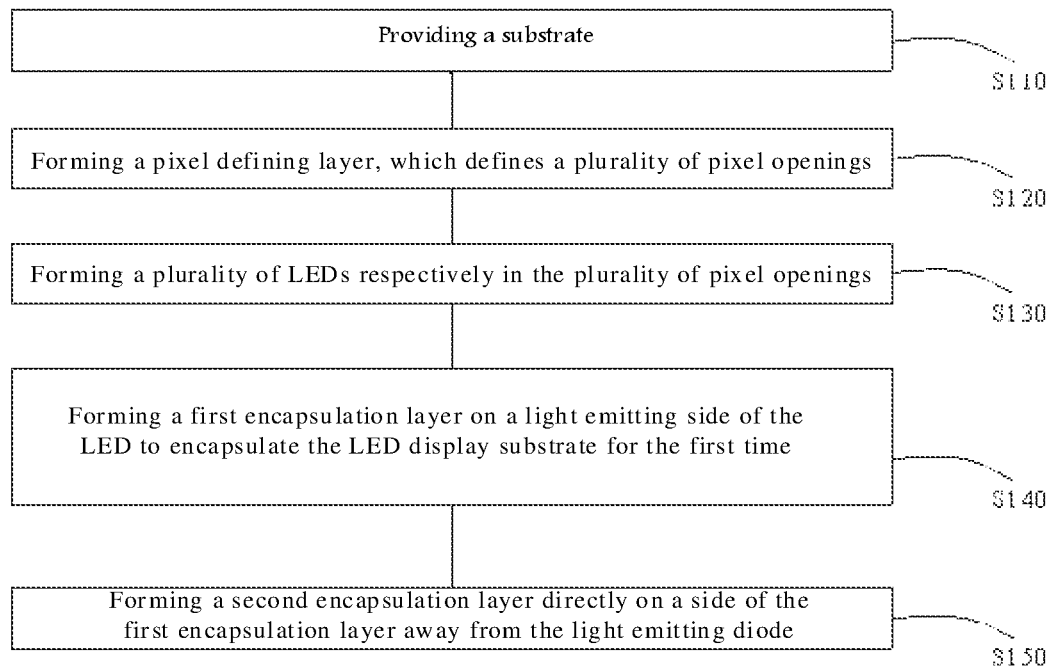
FIG. 4 is a flow chart of a method of manufacturing a light emitting diode display panel according to an embodiment of the present disclosure.

As a second aspect of the present disclosure, a method for manufacturing a light emitting diode display panel is provided. As shown in FIG. 4, the method includes the following steps.

In step S110, a substrate is provided.

In step S120, a pixel defining layer defining a plurality of pixel openings is formed.

In step S130, a plurality of light emitting diodes are formed respectively in the plurality of pixel openings.

In step S140, a first encapsulation layer is formed on a light emitting side of the light emitting diode to encapsulate the light emitting diode display substrate for the first time. A portion of the first encapsulation layer within the pixel opening includes a sidewall inclined with respect to the substrate, a surface of the sidewall close to the light emitting diode includes a plurality of first portions and a plurality of second portions alternately arranged in a direction away from the light emitting diode and connected to each other, inclination angles of the plurality of first portions with respect to the substrate are smaller than inclination angles of the plurality of second portions with respect to the substrate, and a refractive index of a material of the first encapsulation layer is greater than a refractive index of a material of each of layer structures directly on both sides of the first encapsulation layer in a direction perpendicular to the substrate.

The light emitting diode display panel according to the present disclosure described above can be obtained by using the method according to the present disclosure. The advantages of the light emitting diode display panel according to the present disclosure have been described in detail above, and will not be described in detail herein.

In the present disclosure, the method of forming the first encapsulation layer 310 having the surface including the first portions 313 and the second portions 314 is not particularly limited. Similarly, in the present disclosure, the method of forming the first electrode 330 having the surface including the exit surfaces 332 and the reflection surfaces 331 is not particularly limited. For example, an initial electrode layer may be formed first, and then reflection surfaces and exit surfaces may be formed by etching a surface, close to the first encapsulation layer, of a portion of the initial electrode layer within the pixel opening.

Figure 5:
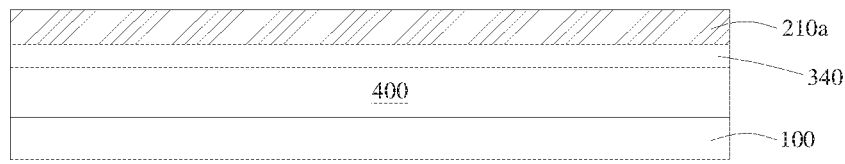
FIG. 5 is a schematic diagram of forming a first pixel defining material layer on a substrate.
Figure 6:
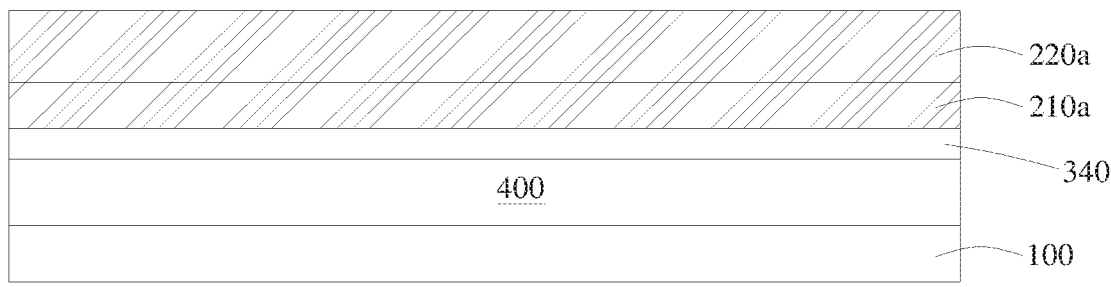
FIG. 6 is a schematic diagram of forming a second pixel defining material layer on a substrate.
Figure 7:
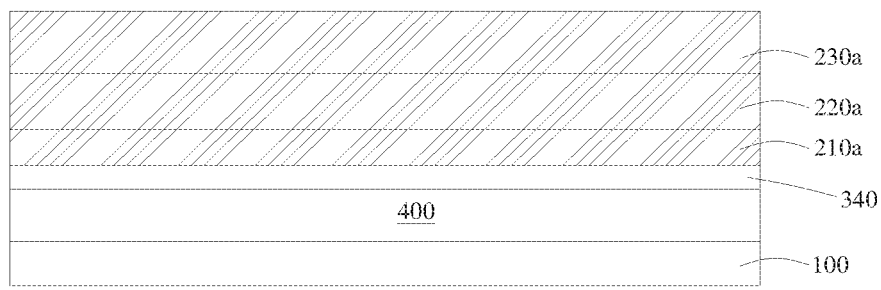
FIG. 7 is a schematic diagram of forming a third pixel defining material layer on a substrate.
Figure 8:
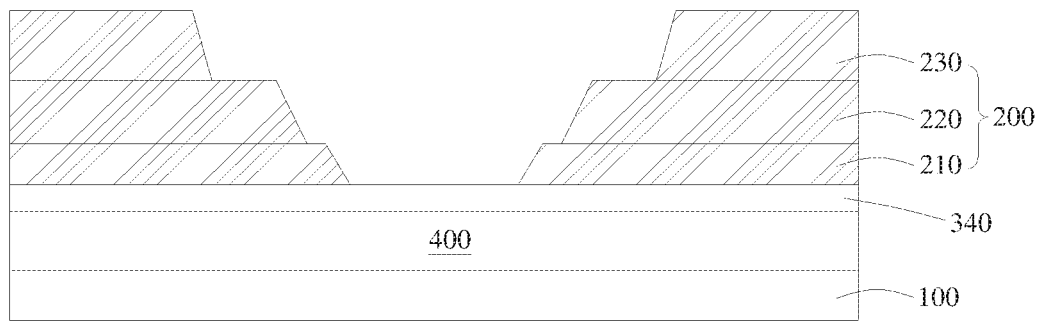
FIG. 8 is a schematic diagram of a pixel defining layer obtained after exposing and developing three pixel defining material layers.

To simplify the patterning process, in an embodiment of the present disclosure, step S120 may include:

sequentially forming a plurality of pixel defining material layers (as shown in FIGS. 5-7), such that a material of each pixel defining material layer includes a negative photoresist and a photosensitizer, and the pixel defining material layer farther from the substrate has a higher photosensitizer content;

exposing a stacked structure formed by the plurality of pixel defining material layers by using a same mask; and developing the stacked structure to obtain a plurality of pixel openings (as shown in FIG. 8), such that each pixel opening includes a plurality of pixel sub-openings sequentially penetrating through the plurality of pixel defining material layer, and the pixel sub-opening farther away from the substrate has a larger opening area.

Because the sensitivities of the plurality of pixel defining material layers are different, when the same mask is used to expose the plurality of pixel defining material layers, sizes of photosensitive regions formed are different, and the sizes of pixel sub-openings formed by development are also different. The pixel defining material layer having a higher photosensitizer content has a higher sensitivity, and the pixel sub-opening formed after developing the pixel defining material layer having a higher photosensitizer content has a larger area.

As one embodiment of the present disclosure, in the step of sequentially forming the plurality of pixel defining material layers, three pixel defining material layers are formed, and the photosensitizer content in the pixel defining material layer closest to the substrate is 1.5 wt % to 2.5 wt %.

In an embodiment of the disclosure, the photosensitizer content in the pixel defining material layer in the middle of the three pixel defining material layers is 2.8 wt % to 3.8 wt %.

In an embodiment of the present disclosure, the photosensitizer content in the pixel defining material layer farthest from the substrate is 4 wt % to 5 wt %.

In some embodiments, the step of forming three pixel defining material layers includes:

as shown in FIG. 5, forming a first pixel defining material layer 210a on the substrate 100;

as shown in FIG. 6, forming a second pixel defining material layer 220a on a side of the first pixel defining material layer 210a away from the substrate 100; and as shown in FIG. 7, forming a third pixel defining material layer 230a on a side of the second pixel defining material layer 220a away from the substrate 100.

Subsequently, a stacked structure formed by the first pixel defining material layer 210a, the second pixel defining material layer 220a, and the third pixel defining material layer 230a is exposed and developed, to obtain a pixel defining layer 200 shown in FIG. 8, which includes a first pixel defining sub-layer 210 formed by the first pixel defining material layer 210a, a second pixel defining sub-layer 220 formed by the second pixel defining material layer 220a, and a third pixel defining sub-layer 230 formed by the third pixel defining material layer 230a.

In an embodiment according to the present disclosure, the method further includes step S150 performed after step S140.

In step S150, a second encapsulation layer is formed directly on a side of the first encapsulation layer away from the light emitting diode, and a refractive index of a material of the second encapsulation layer is smaller than a refractive index of a material of the first encapsulation layer.

As described above, the material of the first encapsulation layer may be silicon nitride, and the material of the second encapsulation layer may be silica gel.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A light emitting diode display panel comprising:
a substrate;
a light emitting diode on the substrate;
a pixel defining layer on the substrate and defining a pixel opening, the light emitting diode being within the pixel opening; and
a first encapsulation layer on a light emitting side of the light emitting diode;
wherein a portion of the first encapsulation layer within the pixel opening comprises a sidewall inclined with respect to the substrate, a surface of the sidewall facing the light emitting diode comprises a plurality of first portions and a plurality of second portions alternately arranged in a direction away from the light emitting diode and connected to each other, inclination angles of the plurality of first portions with respect to the substrate are smaller than inclination angles of the plurality of second portions with respect to the substrate,
a refractive index of a material of the first encapsulation layer is greater than a refractive index of a material of an immediately physically adjoining layer on top of the first encapsulation layer and a refractive index of a material of an immediately physically adjoining layer on bottom of the first encapsulation layer,
the pixel defining layer comprises a plurality of pixel defining sub-layers stacked in a direction away from the substrate, the pixel opening comprises a plurality of pixel sub-openings respectively penetrating through the plurality of pixel defining sub-layers, and opening areas of the plurality of pixel sub-openings increase in the direction away from the substrate, and
a material of each pixel defining sub-layer comprises a negative photoresist containing a photosensitizer, and a pixel defining sub-layer farther away from the substrate has a higher photosensitizer content.

2. The light emitting diode display panel of claim 1, wherein the plurality of first portions are parallel to the substrate.

3. The light emitting diode display panel of claim 2, wherein the inclination angles of the plurality of second portions with respect to the substrate increase in the direction away from the light emitting diode.

4. The light emitting diode display panel of claim 1, wherein inclination angles of sides of the plurality of pixel sub-openings with respect to the substrate increase in the direction away from the substrate.

5. The light emitting diode display panel of claim 1, wherein the pixel defining layer comprises three pixel defining sub-layers, a photosensitizer content in a pixel defining sub-layer closest to the substrate is 1.5 wt % to 2.5 wt %, a photosensitizer content in a pixel defining sub-layer farthest from the substrate is 4 wt % to 5 wt %, and a photosensitizer content in a pixel defining sub-layer in the middle of the three pixel defining sub-layers is 2.8 wt % to 3.8 wt %.

6. The light emitting diode display panel of claim 1, wherein the first encapsulation layer is made of an inorganic material.

7. The light emitting diode display panel of claim 6, further comprising a second encapsulation layer directly on a side of the first encapsulation layer away from the light emitting diode, the second encapsulation layer is made of an organic material, and a refractive index of the first encapsulation layer is greater than a refractive index of the second encapsulation layer.

8. The light emitting diode display panel of claim 1, wherein the light emitting diode comprises a first electrode, the first encapsulation layer is directly on the first electrode, and the first electrode is conformal with the first encapsulation layer.

9. The light emitting diode display panel of claim 8, wherein the first electrode is a transparent electrode.

10. The light emitting diode display panel of claim 1, wherein the first encapsulation layer is uniform in thickness.

11. The light emitting diode display panel of claim 1, further comprising a driver circuit layer between the substrate and the pixel defining layer and configured to drive the light emitting diode to emit light.

12. A method for manufacturing a light emitting diode display panel, comprising:
provi ding a substrate;
forming a pixel defining layer on the substrate, the pixel defining layer defining a pixel opening;
forming a light emitting diode on the substrate, the light emitting diode being formed within the pixel opening;
forming a first encapsulation layer on a light emitting side of the light emitting diode such that a portion of the first encapsulation layer within the pixel opening comprises a sidewall inclined with respect to the substrate, a surface of the sidewall facing the light emitting diode comprises a plurality of first portions and a plurality of second portions alternately arranged in a direction away from the light emitting diode and connected to each other, inclination angles of the plurality of first portions with respect to the substrate are smaller than inclination angles of the plurality of second portions with respect to the substrate,
wherein a refractive index of a material of the first encapsulation layer is greater than a refractive index of a material of an immediately physically adjoining layer on top of the first encapsulation layer and a refractive index of a material of an immediately physically adjoining layer on bottom of the first encapsulation layer,
forming the pixel defining layer comprises: forming a plurality of pixel defining sub-layers which are stacked in a direction away from the substrate, the pixel opening comprises a plurality of pixel sub-openings respectively penetrating through the plurality of pixel defining sub-layers, and opening areas of the plurality of pixel sub-openings increase in the direction away from the substrate, and
a material of each pixel defining sub-layer comprises a negative photoresist containing a photosensitizer, and a pixel defining sub-layer farther away from the substrate has a higher photosensitizer content.

13. The method of claim 12, wherein the plurality of first portions are formed to be parallel to the substrate.

14. The method of claim 13, wherein the inclination angles of the plurality of second portions with respect to the substrate increase in the direction away from the light emitting diode.

15. The method of claim 12, wherein inclination angles of sides of the plurality of pixel sub-openings with respect to the substrate increase in the direction away from the substrate.

16. The method of claim 15, wherein forming the pixel defining layer comprises: sequentially forming a plurality of pixel defining material layers, wherein a material of each pixel defining material layer comprises a negative photoresist and a photosensitizer, and a pixel defining material layer farther away from the substrate has a higher photosensitizer content;
exposing a stacked structure formed by the plurality of pixel defining material layers by using a same mask;
developing the stacked structure to obtain the pixel opening, wherein the pixel opening comprises a plurality of pixel sub-openings which sequentially penetrate through the plurality of pixel defining material layers, and among the plurality of pixel sub-openings, a pixel sub-opening which is farther away from the substrate has a greater opening area.

17. The method of claim 16, wherein in sequentially forming the plurality of pixel defining material layers, three pixel defining material layers are formed, wherein a photosensitizer content in a pixel defining material layer closest to the substrate is 1.5 wt % to 2.5 wt %, a photosensitizer content in a pixel defining material layer farthest from the substrate is 4 wt % to 5 wt %, and a photosensitizer content in a pixel defining material layer in the middle of the three pixel defining material layers is 2.8 wt % to 3.8 wt %.

* * * * *

UNITED STATES PATENT AND TRADEMARK OFFICE
CERTIFICATE OF CORRECTION

| | | |
|---|---|---|
| PATENT NO. | : 11,538,876 B2 | Page 1 of 1 |
| APPLICATION NO. | : 16/673168 | |
| DATED | : December 27, 2022 | |
| INVENTOR(S) | : Binbin Cao | |

It is certified that error appears in the above-identified patent and that said Letters Patent is hereby corrected as shown below:

On the Title Page

Item (73), please add the first Assignee "Hefei Xinsheng Optoelectronics Technology Co., Ltd., Anhui (CN)".

Signed and Sealed this
Twenty-sixth Day of September, 2023

Katherine Kelly Vidal
*Director of the United States Patent and Trademark Office*